United States Patent [19]

Drake et al.

[11] Patent Number: 4,663,304

[45] Date of Patent: May 5, 1987

[54] ACID-TREATED CATALYSTS FOR OLEFIN CONVERSION AND METHOD FOR PREPARING THE CATALYSTS

[75] Inventors: Charles A. Drake; Robert E. Reusser, both of Bartlesville, Okla.

[73] Assignee: Phillips Petroleum Company, Bartlesville, Okla.

[21] Appl. No.: 780,748

[22] Filed: Sep. 27, 1985

Related U.S. Application Data

[62] Division of Ser. No. 632,984, Jul. 20, 1984, Pat. No. 4,570,191.

[51] Int. Cl.$^4$ .................... B01J 21/10; B01J 23/28; B01J 23/30
[52] U.S. Cl. .................... 502/211; 502/27; 502/28; 502/210; 502/254; 502/255; 502/305; 502/321; 502/322; 502/323
[58] Field of Search .................... 502/27, 28, 254, 255, 502/305, 321, 322, 323, 210, 211

[56] References Cited

U.S. PATENT DOCUMENTS

| | | | |
|---|---|---|---|
| 2,608,534 | 8/1952 | Fleck | 502/321 X |
| 3,544,647 | 12/1970 | Pennella | 585/647 X |
| 3,786,112 | 1/1974 | Reusser et al. | 585/646 X |
| 4,089,806 | 5/1978 | Farrell et al. | 502/28 X |
| 4,455,390 | 6/1984 | Ting et al. | 502/254 X |

FOREIGN PATENT DOCUMENTS

| | | | |
|---|---|---|---|
| 960018 | 6/1964 | United Kingdom | 502/27 |
| 1103976 | 2/1968 | United Kingdom | 502/322 |

Primary Examiner—W. J. Shine
Attorney, Agent, or Firm—S. E. Reiter

[57] ABSTRACT

A process for the disproportionation of olefins is disclosed employing a novel catalyst comprising an inorganic oxide support contacted with at least one of tungsten or molybdenum oxide or oxide precursor and at least one acid. Method for preparation of catalyst is also provided.

11 Claims, No Drawings

ACID-TREATED CATALYSTS FOR OLEFIN CONVERSION AND METHOD FOR PREPARING THE CATALYSTS

This application is a division of application Ser. No. 632,984, filed July 20, 1984, now U.S. Pat. No. 4,570,191.

BACKGROUND

This invention relates to catalysts. In accordance with one aspect, this invention relates to catalysts useful for the disproportionation of olefins. In a further aspect, this invention relates to a process for the conversion of olefins. In another aspect, the invention relates to a method for preparing catalysts.

The disproportionation, or metathesis, of olefins is a reaction in which one or more olefinic compounds are transformed into other olefins of different molecular weights. The disproportionation of an olefin with itself to produce an olefin of a higher molecular weight and an olefin of a lower molecular weight can also be referred to as self-disproportionation. For example, propylene can be disproportionated to ethylene and cis-, and trans-2-butene. Another type of disproportionation involves the cross-disproportionation of two different olefins to form still other olefins. An example would be the reaction of one molecule of 2-butene with one molecule of 3-hexene to produce two molecules of 2-pentene.

By the term "disproportionation" or "metathesis" throughout this specification is meant the conversion of the feed olefinic (or unsaturated) hydrocarbon to a mixture of olefinic (or unsaturated) hydrocarbons having different numbers of carbon atoms than the feed hydrocarbons.

Many catalysts have been developed for disproportionation. For example, those comprising inorganic oxide supports containing a catalytic amount of a metal or metal oxide have been employed widely for conversion of olefins. The present invention is based upon the discovery of a way to improve the activity of such catalysts.

OBJECTS OF THE INVENTION

An object of this invention is a catalyst and process which give improved reactant selectivity and product yield upon the conversion of olefins.

Another object of the invention is a catalyst and process which give improved reactant selectivity and product yield upon the disproportionation of olefins.

These and other objects of the invention will become apparent from the disclosure and claims herein provided.

STATEMENT OF THE INVENTION

In accordance with the invention, I have discovered that the addition of at least one acid to a supported tungsten- or molybdenum-containing catalyst surprisingly results in a novel catalyst which gives improved feed conversion and product selectivity when employed for the disproportionation of olefins.

DESCRIPTION OF THE PREFERRED EMBODIMENTS

Thus, in accordance with the present invention, a composition is provided comprising:
(a) a first catalyst component comprising:
  (i) an inorganic oxide support,
  (ii) at least one of tungsten and molybdenum oxide or oxide precursor, and
  (iii) at least one acid selected from the group consisting of:
    $HNO_3$,
    HX, wherein X is a halogen,
    $R-CO_2H$, wherein R is hydrogen or a $C_1$ through $C_{10}$ hydrocarbyl radical,
    and mixtures of any two or more thereof.

In accordance with another embodiment of the invention a process is provided for the disproportionation of olefinic hydrocarbons by contacting the same with a disproportionation catalyst as hereinbefore described.

In accordance with yet another embodiment of the invention a method is provided for the preparation of catalyst compositions as hereinbefore described.

Catalyst

The term inorganic oxide support is intended to include those support materials which are useful for preparation of heterogeneous catalysts. Suitable support materials include alumina, silica, silica-alumina, magnesia-titania, thoria, aluminum phosphate, zirconium phosphate, titanium phosphate, calcium phosphate, magnesium phosphate and the like and mixtures of any two or more thereof. Silica is a preferred support because of its ready availability, ease of handling and resultant good activity of catalysts prepared with silica as support.

The oxide or oxide precursor of tungsten or molybdenum used to treat the inorganic oxide support can be employed as a dry powder, granule or the like, as well as an aqueous solution or suspension of oxide or oxide precursor. When oxide precursor is employed, it is subsequently converted to the oxide form by calcination. Suitable oxide or oxide precursors are compounds which are convertible to the oxide form under calcination conditions, such as, for example, the halides, oxides, sulfides, sulfates, nitrates, acetates and the like, and mixtures of any two or more thereof.

Exemplary tungsten compounds include tungsten pentabromide, tungsten dichloride, tungsten tetrachloride, tungsten hexafluoride, tungsten trioxide, tungsten dioxydichloride, tungsten trisulfide, metatungstic acid, orthotungstic acid, ammonium phosphotungstate, ammonium metatungstate and the like and mixtures of any two or more thereof.

Exemplary molybdenum compounds include molybdenum tetrabromide, molybdenum hydroxide, molybdenum pentoxide, molybdenum trioxide, molybdenum dioxydibromide, molybdenum oxytetrachloride, molybdenum dioxydifluoride, molybdenum trisulfide, ammonium molybdate, ammonium paramolybdate, ammonium permolybdate, ammonium phosphomolybdate and the like, and mixtures of any two or more thereof.

The proportion of tungsten or molybdenum oxide or oxide precursor combined with the inorganic oxide support can vary appreciably, but generally the support will contain at least about 0.1% by weight of the metal, calculated as the oxide and based on the combined weight of metal oxide and inorganic oxide support. Generally, the support will contain an upper limit of about 40% by weight of the metal, calculated as the oxide and based on the combined weight of metal oxide and inorganic oxide support. Amounts of about 0.2 to about 40% by weight of the metal, calculated as the oxide, are preferred, with amounts of about 2 to about 20% by weight of the metal, calculated as the oxide, especially preferred because good catalyst reactivities and product selectivities are obtained.

In addition to applying tungsten or molybdenum oxide or a tungsten or molybdenum oxide precursor to the inorganic oxide support, in accordance with the invention the support is further treated with at least one acid selected from the group consisting of:

$HNO_3$,

HX, wherein X is a halogen, $R-CO_2H$, wherein R is hydrogen or a $C_1$ through $C_{10}$ hydrocarbyl radical, and mixtures of any two or more thereof.

Preferred are the hydrogen halides, nitric acid, formic acid and acetic acid for their ready availability and ease of dissolution in commonly employed solvents such as water. Especially preferred for the same reasons as well as the excellent feed conversions and product selectivities obtained are the hydrogen halides, such as, for example, hydrogen chloride and hydrogen bromide, as well as nitric acid.

The proportion of at least one acid selected from the above group combined with the inorganic oxide support can vary appreciably, but generally the support will contain at least about 0.01% by weight of the acid, calculated as free acid and based on the weight of inorganic oxide support. Generally amounts of about 0.01 to about 1% by weight of the acid, calculated as free acid, are useful; amounts of about 0.05 to about 1% by weight of acid, calculated as free acid, are preferred because significant improvements in catalyst performance are obtained. Amounts of about 0.05 to about 0.5% by weight of acid, calculated as free acid are especially preferred because excellent catalyst performance is achieved with minimal reagent expense.

Other modifying agents which one may wish to incorporate into the inorganic oxide support-treating solution or to apply to the support either before or after contacting the support with a treating solution containing tungsten or molybdenum oxide or oxide precursor and/or at least one acid selected from the above group may also be employed.

The inorganic oxide support can be separately treated with suitable tungsten or molybdenum oxide or oxide precursors, followed by treating with at least one acid selected from the above group. Alternatively, the support can separately be treated first with at least one acid selected from the above group, then with the tungsten or molybdenum oxide or oxide precursor. Preferably, for ease of catalyst preparation, support can be treated once with a combination of support-treating reagents containing suitable amounts of both the tungsten or molybdenum oxide or oxide precursors and at least one acid selected from the above group.

The inorganic oxide support and support-treating reagents can be contacted in any suitable manner. For example, the inorganic oxide support and support-treating reagents can be mixed in an open vessel. When the support-treating reagents are provided as a solution, such as for example, an aqueous solution, once the inorganic oxide support and support-treating solution are mixed, then any excess liquid can be decanted or removed by filtration. Alternatively, the technique of incipient wetness can be employed whereby only enough liquid is employed to thoroughly wet the inorganic oxide support, with no free residual liquid. Thus, only as much support-treating solution is employed as the inorganic oxide support can absorb. This can be accomplished, for example, by spraying support-treating solution over a quantity of inorganic oxide which is being tumbled in a rotating, baffled drum. Such treatment can also be carried out by simply pouring a predetermined quantity of support-treating solution over a quantity of inorganic oxide support contained in an open vessel. Alternatively, a measured quantity of inorganic oxide support could be added to a volume of support-treating solution such that all the liquid is imbibed by the added support. Other techniques as are known to those skilled in the art can also be employed. For example, a quantity of inorganic oxide support may be placed in a tubular reactor, a volume of support-treating solution may be percolated therethrough, followed by further treatment/activation as necessary.

The conditions of inorganic oxide support/support-treating reagent contacting are not critical. Any temperature and any period of contact time is suitable. For convenience, contacting is generally carried out at about room temperature, although higher or lower temperatures can be employed. When support-treating reagents are provided as an aqueous solution, contacting is preferably carried out at a temperature not exceeding about 100° C. A time period sufficient to allow the support and reagents to come into intimate contact is all that is necessary. Thus, the inorganic oxide support and support-treating reagents may be brought into contact for as little time as a few seconds to several hours or more, as convenient.

Following contact of the inorganic oxide support and support-treating reagents, any excess liquid (if solvent or diluent is employed) can be removed by suitable means, such as, for example, decantation, filtration or the like. The treated support can then be dried to remove absorbed solvent. Any suitable means, as well known by those skilled in the art, may be employed such as, for example, oven drying, passing a vigorous stream of dry (moisture-free) gas over the treated support and the like. For example, the first catalyst component, prepared as hereinabove described, can be dried by heating at an elevated temperature of say about 200° C. or higher by passage of an inert gas such as nitrogen over the first catalyst component. This can be accomplished within the reactor or in other suitable catalyst preparation equipment.

Calcination, when used, is conducted by heating the treated catalyst in the presence of an oxygen-containing gas such as, for example, air, under conditions sufficient to activate the metal oxide or to convert the metal compound present to the activated oxide form. Temperatures in the range of about 350° C. to about 800° C. are generally satisfactory for such calcination. The time for subjecting the first catalyst component to calcination is an amount of time sufficient to activate the first catalyst component. Anywhere from a few minutes to several hours is suitable. Typically, about 15 minutes to about 20 hours of calcination will be sufficient. Preferably, for most efficient use of reaction equipment, the first catalyst component will be subjected to calcination for about 30 minutes to about 6 hours. Typically less time is required at higher temperatures and vice versa. After calcination, the first catalyst component is optionally treated under reducing conditions such as for example with carbon monoxide, hydrogen or a hydrocarbon at a temperature in the range of about 400° up to about 750° C. to enhance the disproportionation activity of the first catalyst component. Such reducing treatment is carried out preferably at about 500° up to about 650° C., because good catalyst activity with reasonably short activation periods of about one to about six hours is achieved. Such optional reducing treatment can suitably be carried out for a period of time ranging from about 1 minute to about 30 hours. If desired the thus-calcined first catalyst component can be further treated with an inert gas such as nitrogen prior to use in a conversion process to remove materials from the catalyst which may have a detrimental effect on subsequent reactions such as the disproportionation reaction.

In accordance with a specific embodiment of our invention, the first catalyst component described hereinabove can optionally be admixed with a second catalyst component comprising a double bond isomerization catalyst. The addition of the second catalyst component provides increased feed conversion compared to reaction employing the first catalyst component only. A wide variety of double bond isomerization catalysts can be used as the second catalyst component in the practice of the invention. Preferred catalysts are those which have little or no polymerization or cracking activity and which are active for double bond isomerization at conditions suitable for obtaining a disproportionated product with the selected disproportionation catalyst. Suitable catalysts can be selected from among those available in the art, such as supported phosphoric acid, bauxite, supported alkali metal, alumina-supported cobalt oxide or iron oxide or manganese oxide. Preferred for their ready availability and good results are zinc oxide, magnesium oxide (magnesia), calcium oxide, cerium oxide, thorium oxide, titanium oxide, and the like, and mixtures of any two or more thereof. Excellent results are obtained with magnesium oxide.

Magnesia suitable for use in the invention can be any suitably activated material known in the art. The material normally has a surface area of at least 1 $m^2/g$. The magnesia can be naturally occurring, such as the mineral Brucite, or can be synthetically prepared by suitable techniques. Minor amounts of other materials such as silica, alumina, and the like, can be present, but the preferred material is principally magnesium oxide. Depending upon the contacting technique used for the olefin conversion reaction, the activated magnesium oxide can be in the form of pellets, extrudates, agglomerates, or even a fine powder. Before use in the process, the magnesium oxide is activated in a suitable manner such as for example by heating in a flowing stream of an oxygen-containing gas for about 1 to 30 hours at about 250° to about 800° C.; preferably for good results in a reasonably short period of time, about 300° to about 600° C. After calcination, the magnesium oxide is optionally treated under reducing conditions analogous to those treatment conditions described above with respect to the first catalyst component. Thus, magnesium oxide is treated with a reducing gas such as for example carbon monoxide, hydrogen or a hydrocarbon at a temperature in the range of about 400° to about 750° C. to enhance the activity of the magnesium oxide. Such reducing treatment is carried out preferably at about 500° up to about 650° C., because good catalyst activity with reasonably short activation periods of about one to about six hours is achieved. Such optional reducing treatment can suitably be carried out for a period of time ranging from about 1 minute to about 30 hours. After activation, it is sometimes advisable to flush the catalyst with an inert gas to remove any adsorbed oxygen or other gases from the magnesium oxide. The regeneration of magnesium oxide catalyst is generally accomplished by a technique which is similar to the activation of this material and can be carried out simultaneously with the regeneration and activation of the first catalyst component with which it is being utilized.

When preparing a mixed bed of the first catalyst component and the second catalyst component, particles of the first catalyst component and particles of the second catalyst component of about the same particle size can be blended. Alternatively, both the first catalyst component and the second catalyst component can be intimately blended such as by grinding into a powder, the powder then formed into other shapes such as pellets, tablets, agglomerates, extrudates, and the like, such that each particle in the catalytic zone comprises an intimate blend of the two catalyst components.

Other appropriate techniques for obtaining a composite of the two catalyst components can be used.

The proportion of second catalyst component to the first catalyst component in the optional composite catalyst system can vary widely. At least about 0.1 part by weight of the second catalyst component should be present for each part by weight of the first catalyst component. There is no theoretical upper limit for the amount of the second catalyst component which can be present. Preferred ratios, for ease of catalyst blending, are about 0.5 to about 20 parts by weight of the second catalyst component per part by weight of the first catalyst component. Ratios of about 2 to about 10 parts by weight of the second catalyst component per part by weight of the first catalyst component are especially preferred because excellent catalyst performance is obtained.

Catalysts according to the invention are useful, for example, for the conversion of olefins via the olefin disproportionation or olefin metathesis reaction.

Reactants

The process of the present invention comprises contacting at least one olefin selected from the group consisting of acyclic mono- and polyenes having at least three up to 30 carbon atoms per molecule and cycloalkyl and aryl derivatives thereof; cyclic mono- and polyenes having at least four up to 30 carbon atoms per molecule and alkyl and aryl derivatives thereof; mixtures of two or more of the above olefins; and mixtures of ethylene with one or more of the above olefins capable of undergoing disproportionation with catalysts prepared according to the invention. Where mixtures of the above olefins with ethylene are subjected to disproportionation reaction conditions, it is desirable that the molar ratio of ethylene to olefin be at least 2. Preferably, ethylene:olefin ratios of about 4:1 or higher will be employed for good results.

Some specific examples of olefins suitable for reactions of this invention include propylene, 1-butene, 2-butene, 1-pentene, 2-pentene, 2,4,4-trimethyl-2-pentene and 2,4,4-trimethyl-1-pentene (diisobutylene isomer), 1-hexene, 1,4-hexadiene, 2-heptene, 1-octene, 2,5-octadiene, 2-nonene, 1-dodecene, 2-tetradecene, 1-hexadecene, 1-phenyl-2-butene, 4-octene, 3-eicosene, 3-hexene, vinylcyclohexane, 1,4-pentadiene, 1,4,7-dodecatriene, 2-methyl-4-octene, 4-vinylcyclohexene, 1,7-octadiene, 1,5,9,13,17-octadecapentaene, 8-cyclopentyl-4,5-dimethyl-1-decene, 6,6-dimethyl-1,4-octadiene, and 3-heptene, and the like, and mixtures of two or more thereof.

Some specific examples of cyclic olefins suitable for the reactions of this invention are cyclobutene, cyclopentene, cycloheptene, cyclooctene, 5-n-propylcyclooctene, cyclodecene, cyclododecene, 3,3,5,5-tetramethylcyclononene, 3,4,5,6,7-pentaethylcyclodecene, 1,5-cyclooctadiene, 1,5,9-cyclodecatriene, 1,4,7,10-cyclododecatetraene, 6-methyl-6-ethyl-1,4-cyclooctadiene and the like, and mixtures of two or more thereof.

Disproportionation Reaction Conditions

A catalyst comprising a first catalyst component, optionally admixed with a second catalyst component as hereinbefore described is useful, for example, for the conversion of olefins via the olefin disproportionation reaction.

The reaction temperature can vary depending upon the catalyst(s) and feed(s) employed and upon the desired reaction products. Typically the disproportionation reaction is carried out at a temperature in the range of about 0° to about 600° C.; preferably for good conversion in relatively short reaction times, temperatures of from about 20° to about 500° C. are employed.

The disproportionation reaction can be carried out by contacting the olefins to be disproportionated with the catalyst in the liquid phase or the gas phase depending on the structure and molecular weight of the olefin. Pressure during the disproportionation reaction can vary between wide limits. For example, pressures between 0.1 and 500 atmospheres are suitable, although preferred pressures are between about 1 and 40 atmospheres because good conversions are obtained with readily available equipment.

If the reaction is carried out in the liquid phase, solvents or diluents for the reactants can be used. Aliphatic saturated hydrocarbons e.g., pentanes, hexanes, cyclohexanes, dodecanes and aromatic hydrocarbons such as benzene and toluene are suitable. If the reaction is carried out in the gaseous phase, diluents such as saturated aliphatic hydrocarbons, for example, methane, ethane, and/or substantially inert gases, e.g. nitrogen, argon, can be present. Preferably, for high product yield, the disproportionation reaction is effected in the absence of significant amounts of deactivating materials such as water and oxygen.

The contact time needed to obtain a reasonable yield of disproportionation products depends upon several factors such as the activity of the catalyst, temperature, pressure and structure of the olefinically unsaturated compound(s) to be disproportionated. Length of time during which the olefinic unsaturated compounds to be disproportionated are contacted with the catalyst can conveniently vary beween 0.1 seconds and 24 hours although longer and shorter contact times can be used. Preferably, for efficient use of reactor equipment, times of about 1 second to about 1 hour are used.

The process of the invention can be effected batchwise or continuously with fixed catalyst beds, slurried catalyst, fluidized beds, or by using any other conventional contacting techniques.

Products

The olefinic products of the invention have established utility including use as precursors of polymers, e.g., as the third component of ethylene-propylene terpolymers useful as synthetic elastomers. Cleavage of the ethylenic bonds of polyolefinic products as by ozonization produces di- or polycarboxylic acids which are reacted with diamines, e.g., hexamethylenediamine, to form polyamides which are useful in synthetic fibers. The olefinic products are converted to secondary and tertiary alcohols as by sulfuric acid-catalyzed hydration. Alternatively, the olefinic products are converted by conventional "Oxo" processes to aldehydes which are hydrogenated with conventional catalysts to the corresponding alcohols. The $C_{12}$–$C_{20}$ alcohols thereby produced are ethoxylated as by reaction with ethylene oxide in the presence of a basic catalyst, e.g., sodium hydroxide, to form conventional detergents and the lower molecular weight alcohols are esterified by reaction with polybasis acids, e.g., phthalic acid, to form plasticizers for polyvinyl chloride.

A further understanding of the present invention and its advantages will be provided by reference to the following examples.

EXAMPLE I

Catalyst Preparation

Catalyst samples were prepared by spraying an aqueous solution of ammonium metatungstate and acid, where applicable, on to the silica support which was contained in a beaker fastened to a rotating table. The solution was added at a rate that permitted good absorption of the solution by the silica support. The catalyst was dried in a moving stream of dry nitrogen, then heated at 100° C. for 0.5 hr and finally at 250° C. for 2 hours. Normally, this first catalyst component (4.3 grams) was mixed with the second catalyst component, i.e., magnesium oxide (10.7 grams; Dart Industries, Catalyst Division, 555 Garden Street, Elyria, Ohio, 44036, now Catalyst Resources, Inc.) before activation. The mixture was then heated in the presence of air at 538° C. for 3–8 hours followed by heating at the same temperature in the presence of carbon monoxide for 10–30 minutes, and finally cooled to reaction temperature ready for the introduction of reactant feed.

| | |
|---|---|
| Catalyst A (Control) | 7.2% $WO_3/SiO_2$ |
| Catalyst B | 7.2% $WO_3/SiO_2$ + $HNO_3$ (<0.1%) |
| Catalyst C | 7.2% $WO_3/SiO_2$ + HCl (<0.1%) |
| Catalyst D (Control) | 9.0% $WO_3/SiO_2$ |
| Catalyst E | 7.2% $WO_3/SiO_2$ + $HNO_3$ (<0.2%) |

EXAMPLE II

Disproportionation of Ethylene plus Diisobutylene

All runs were made by passing ethylene and a mixture of diisobutylene isomers (2,4,4-trimethyl-1-pentene and 2,4,4-trimethyl-2-pentene) downflow through a vertical pipe reactor (½ inch diameter and 20 inches in length) positioned in a temperature-controlled electric furnace. A thermocouple was positioned in the catalyst bed to monitor reaction temperature.

About 5 inches depth of alpha-alumina particles were placed at the bottom of the pipe reactor supported with a layer of glass wool. The bed of alpha-alumina particles supported an admixture of 4.3 grams (g) $WO_3/SiO_2$ and 10.7 g activated (at 538° C.) MgO. This was topped with another layer of glass wool and the remaining reactor spaced filled with alpha-alumina. The catalyst was activated by heated at 538° C. in flowing air for 8 hrs followed by a 30 minute treatment with flowing carbon monoxide at 538° C.

Ethylene used in the reaction was passed through a 13X mol sieve drier and diisobutylene employed was passed over a magnesium oxide guard bed. Feed was introduced into the reactor maintained at about 373° C. and 400 psig pressure. An ethylene:diisobutylene molar ratio of about 2:1 was introduced at a diisobutylene feed rate of about 30 weight hourly space velocity (WHSV). Product samples were collected in a high pressure syringe and were analyzed in a Hewlett Packard Model 5840 gas chromatograph using a ⅛"×20' column packed with 10% OV101 (dimethylsilicone available from Supelco, Inc., Bellefonte, Pa.) on Chromosorb P (red diatomaceous earth available from Applied Science, Deerfield, Ill.). Reaction results are summarized in Table I. Conversion of diisobutylene (Conv) and selectively to neohexane (Sel) values presented in Table I are calculated as weight % of total reactor effluent.

TABLE I

| Reaction time, hrs. | Run 1 (A + MgO; cont) | | Run 2 (B + MgO; inv) | | Run 3 (C + MgO; inv) | |
|---|---|---|---|---|---|---|
| | Conv | Sel | Conv | Sel | Conv | Sel |
| 1¾ | 82 | 61 | 90 | 75 | 92 | 88 |
| 4¾ | 73 | 39 | 74 | 84 | 78 | 88 |

The data in Table I show that the catalyst compositions of the invention (Runs 2 and 3) show improved conversion and dramatically improved selectivity compared to a prior art catalyst composition (Run 1).

EXAMPLE III

Disproportionation of Ethylene plus 2-Butene

All runs were made by passing ethylene and a mixture of cis- and trans-2-butene downflow through a vertical pipe reactor (½ inch diameter and 20 inches in length) positioned in a temperature-controlled electric furnace. A thermocouple was positioned in the catalyst bed to monitor reaction temperature.

About 6 inches depth of quartz chips (−9+12 mesh) were placed at the bottom of the pipe reactor supported by a layer of quartz wool. Another layer of quartz wool was placed on top of the quartz chips as support for a combined catalyst bed comprising about 1.5 g of silica supported $WO_3$ catalyst mixed with about 4.5 g of α-alumina as the second catalyst component. This was topped with another layer of quartz wool and the remainder of the reactor filled with quartz chips. The combined catalyst was activated by heating at 538° C. in flowing air for three hours, followed by about 15-minute treatment with flowing carbon monoxide at the same temperature and finally the catalyst was cooled under flowing nitrogen to reaction temperature.

Ethylene used in the reaction was passed through a 13X mol sieve drier and butene feedstock was percolated through 13X mol sieve, then alumina and finally magnesium oxide prior to use. Feed introduced into the reactor was maintained at about 400 psig pressure and between about 343° and 371° C. (650°–700° F.). Ethylene:butene molar ratios of about 3/1 to about 8/1 were investigated with a total feed introduction rate of about 30 weight hourly space velocity (WHSV).

The hot reactor effluent was vented to a hood; periodically the total effluent was sampled using a modified, heated Series A-2 Sample-Lok syringe (Dynatech Precision Sampling Corporation). Analyses were carried out on a ⅛"×20' OV-101 column at an initial temperature of 50° C. programmed up to 200° C. Reaction results are summarized in Table II. Conversion of 2-butene (Conv) and selectivity to propylene (Sel) values presented in Table II are calculated as weight percent.

TABLE II

| Run No. | Catalyst Composition | Reaction Temp, °C. | Ethylene/Butene | Total Run Time, Hrs | Conv | Sel |
|---|---|---|---|---|---|---|
| 4 | D + α-Al₂O₃ (control) | 343 | 8:1 | 0.5 | 29 | 57 |
| | | 371 | | 1.0 | 38 | 73 |
| | | 371 | | 2.0 | 39 | 73 |
| 5 | E + α-Al₂O₃ (invention) | 343 | 8:1 | 0.5 | 87 | 84 |
| | | | | 1.0 | 64 | 76 |
| | | | | 2.0 | 57 | 73 |
| 6 | C + α-Al₂O₃ (invention) | 354 | 3:1 | 0.75 | 62 | 99 |
| | | | | 2.0 | 53 | 99 |

Comparison of invention runs 5 and 6 with control run 4 demonstrates that higher conversion and selectivity result with the invention catalyst composition.

We claim:

1. A method comprising:
   (a) contacting an inorganic oxide support at a temperature not exceeding about 100° C. in aqueous media with
      (i) at least one of tungsten or molybdenum oxide or oxide precursor, and
      (ii) at least one acid selected from the group consisting of:
         $HNO_3$,
         HX, wherein X is a halogen,
         R—$CO_2$H, wherein R is hydrogen or a $C_1$ though $C_{10}$ hydrocarbyl radical, and mixtures of any two or more thereof; and
   (b) treating the product of step (a) under conditions suitable to activate said at least one of tungsten or molybdenum oxide or oxide precursor to the activated oxide form.

2. A method in accordance with claim 1 wherein said treating conditions suitable to activate said at least one of tungsten and molybdenum oxide or oxide precursor to the activated oxide form comprise heating in the presence of an oxygen-contaning gas to a temperature of about 350° C. to about 800° C. for a time sufficient to activate the catalyst.

3. A method in accordance with claim 1 wherein the tungsten oxide precursor is ammonium metatungstate.

4. A method in accordance with claim 1 wherein the molybdenum oxide precursor is ammonium molybdate.

5. A method in accordance with claim 1 wherein said inorganic oxide support is selected from the group consisting of:
   silica
   alumina,
   silica-alumina
   aluminum phosphate,
   zirconium phosphate,
   titanium phosphate,
   calcium phosphate,
   magnesium phosphate,
   magnesia-titania,
   thoria,
and mixtures of any two or more thereof.

6. A method in accordance with claim 1 further comprising:
   (c) admixing the product of step (b) with a double bond isomerization catalyst.

7. A method in accordance with claim 6 wherein said double bond isomerization catalyst is magnesium oxide.

8. The composition prepared in accordance with the method of claim 1.

9. The composition prepared in accordance with the method of claim 5.

10. The composition prepared in accordance with the method of claim 6.

11. The composition prepared in accordance with the method of claim 7.

* * * * *